US011867774B2

(12) United States Patent
Ferdous et al.

(10) Patent No.: US 11,867,774 B2
(45) Date of Patent: Jan. 9, 2024

(54) SYSTEMS AND METHODS TO USE CUSTOMIZED QUALITY CONTROL TASKS FOR NON-DESTRUCTIVE TESTING

(71) Applicant: Illinois Tool Works Inc., Glenview, IL (US)

(72) Inventors: Sakif B. Ferdous, Skokie, IL (US); Wyatt M. Burns, Woodridge, IL (US); Justin J. Stewart, DeWitt, IA (US); Michael F. Fryauf, West Branch, IA (US)

(73) Assignee: Illinois Tool Works Inc., Glenview, IL (US)

( * ) Notice: Subject to any disclaimer, the term of this patent is extended or adjusted under 35 U.S.C. 154(b) by 1022 days.

(21) Appl. No.: 16/385,554

(22) Filed: Apr. 16, 2019

(65) Prior Publication Data
US 2019/0317158 A1    Oct. 17, 2019

Related U.S. Application Data

(60) Provisional application No. 62/658,861, filed on Apr. 17, 2018.

(51) Int. Cl.
*G01R 33/00* (2006.01)
*G01R 33/12* (2006.01)
(Continued)

(52) U.S. Cl.
CPC ..... *G01R 33/0023* (2013.01); *G01R 33/1276* (2013.01); *G06Q 10/06395* (2013.01);
(Continued)

(58) Field of Classification Search
CPC ............. G01R 33/0023; G01R 33/1276; G01R 33/00; G01R 33/12; G06Q 10/06395;
(Continued)

(56) References Cited

U.S. PATENT DOCUMENTS

| 4,703,263 A * | 10/1987 | Schiffert ................ G01N 27/84 |
|---|---|---|
| | | 324/216 |
| 2002/0116084 A1 * | 8/2002 | Falsetti .................. G06Q 10/06 |
| | | 700/109 |

(Continued)

FOREIGN PATENT DOCUMENTS

| CN | 101915564 | 12/2010 | |
|---|---|---|---|
| CN | 102057403 A * | 5/2011 | ............. G06T 19/00 |

(Continued)

OTHER PUBLICATIONS

Int'l Search Report and Written Opinion Appln No. PCT/US2019/027830 dated Jul. 11, 2019.

(Continued)

*Primary Examiner* — Daniel R Miller
*Assistant Examiner* — Christian T Bryant
(74) *Attorney, Agent, or Firm* — McAndrews, Held & Malloy, Ltd.

(57) ABSTRACT

Systems and methods to use customized quality control tasks for non-destructive testing (NDT) are disclosed. An example NDT system includes at least one of a magnetic particle inspection device or a penetrant testing device, a user interface device, a processor, and a memory coupled to the processor and storing machine readable instructions. When executed, the instructions cause the processor to: access a quality verification procedure comprising a plurality of tasks and corresponding task definitions; display one or more of the plurality of tasks based on statuses of the plurality of tasks; receive one or more results associated with the one or more of the plurality of tasks; store the one or more results in association with the magnetic particle inspection device or the penetrant testing device; and control at least one aspect of the magnetic particle inspection device (Continued)

or the penetrant testing device based on the one or more results.

15 Claims, 7 Drawing Sheets

(51) Int. Cl.
    *G01N 27/84* (2006.01)
    *G01D 18/00* (2006.01)
    *G01D 21/00* (2006.01)
    *G06Q 10/0639* (2023.01)

(52) U.S. Cl.
    CPC ............ *G01D 18/00* (2013.01); *G01D 21/00* (2013.01); *G01N 27/84* (2013.01); *G01R 33/00* (2013.01); *G01R 33/12* (2013.01); *H04Q 2213/052* (2013.01)

(58) Field of Classification Search
    CPC ........ G01D 21/00; G01D 18/00; G01N 27/84; H04Q 2213/052
    See application file for complete search history.

(56) References Cited

U.S. PATENT DOCUMENTS

| | | | | |
|---|---|---|---|---|
| 2014/0207403 A1* | 7/2014 | Messinger | ............... | G06F 17/00 702/123 |
| 2014/0207406 A1* | 7/2014 | Domke | ............ | G06Q 10/06311 702/150 |
| 2015/0049108 A1 | 2/2015 | Bourgelas | | |

FOREIGN PATENT DOCUMENTS

| | | | | |
|---|---|---|---|---|
| CN | 102510393 | | 6/2012 | |
| CN | 102844658 | | 12/2012 | |
| CN | 103308593 | | 9/2013 | |
| CN | 104062354 | | 9/2014 | |
| CN | 104884949 | | 9/2015 | |
| GB | 2500281 A | * | 9/2013 | ............. G01N 21/91 |
| JP | S6138451 A | | 2/1986 | |
| JP | 2001281226 A | * | 10/2001 | |
| JP | 2005351910 | | 12/2005 | |
| JP | 2006065582 | | 3/2006 | |
| JP | 2006194816 | | 7/2006 | |
| JP | 2009074830 | | 4/2009 | |
| JP | 2009075098 | | 4/2009 | |
| WO | 2012122542 | | 9/2012 | |
| WO | WO-2012122542 A2 | * | 9/2012 | ............. G01N 21/91 |
| WO | 2016111794 | | 7/2016 | |
| WO | 2017221024 | | 12/2017 | |
| WO | WO-2017221024 A1 | * | 12/2017 | ............. G01N 21/63 |

OTHER PUBLICATIONS

European Office Communication Appln No. 19721485.1 dated Feb. 16, 2022.
European Office Communication Appln No. 19721485.1 dated Mar. 20, 2023.
Japanese Office Action Appln No. 2020-557183 dated Jun. 26, 2023.

* cited by examiner

FIG. 6

SYSTEMS AND METHODS TO USE CUSTOMIZED QUALITY CONTROL TASKS FOR NON-DESTRUCTIVE TESTING

RELATED APPLICATIONS

This patent claims priority to U.S. Provisional Patent Application Ser. No. 62/658,861, filed Apr. 17, 2018, entitled "SYSTEMS AND METHODS TO USE CUSTOMIZED QUALITY CONTROL TASKS FOR NON-DESTRUCTIVE TESTING." The entirety of U.S. Provisional Patent Application Ser. No. 62/658,861 is incorporated herein by reference.

FIELD OF THE DISCLOSURE

This disclosure relates generally to non-destructive testing and, more particularly, to systems and methods to use customized quality control tasks for non-destructive testing.

BACKGROUND

Non-destructive testing (NDT) is used to evaluate properties and/or characteristics of material, components, and/or systems without causing damage or altering the tested item. Because non-destructive testing does not permanently alter the article being inspected, it is a highly valuable technique, allowing for savings in cost and/or time when used for product evaluation, troubleshooting, and research. Frequently used non-destructive testing methods include magnetic-particle inspections, eddy-current testing, liquid (or dye) penetrant inspection, radiographic inspection, ultrasonic testing, and visual testing. Non-destructive testing (NDT) is commonly used in such fields as mechanical engineering, petroleum engineering, electrical engineering, systems engineering, aeronautical engineering, medicine, art, and the like.

Further limitations and disadvantages of conventional approaches will become apparent to one management of skill in the art, through comparison of such approaches with some aspects of the present method and system set forth in the remainder of this disclosure with reference to the drawings.

SUMMARY

Systems and methods to use customized quality control tasks for non-destructive testing are disclosed.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIG. 6 is an example interface that may be presented by the controller of FIG. 1, and/or by a remote computing device, to modify a task definition.

The figures are not necessarily to scale. Where appropriate, similar or identical reference numbers are used to refer to similar or identical components.

DETAILED DESCRIPTION

Figure 1:
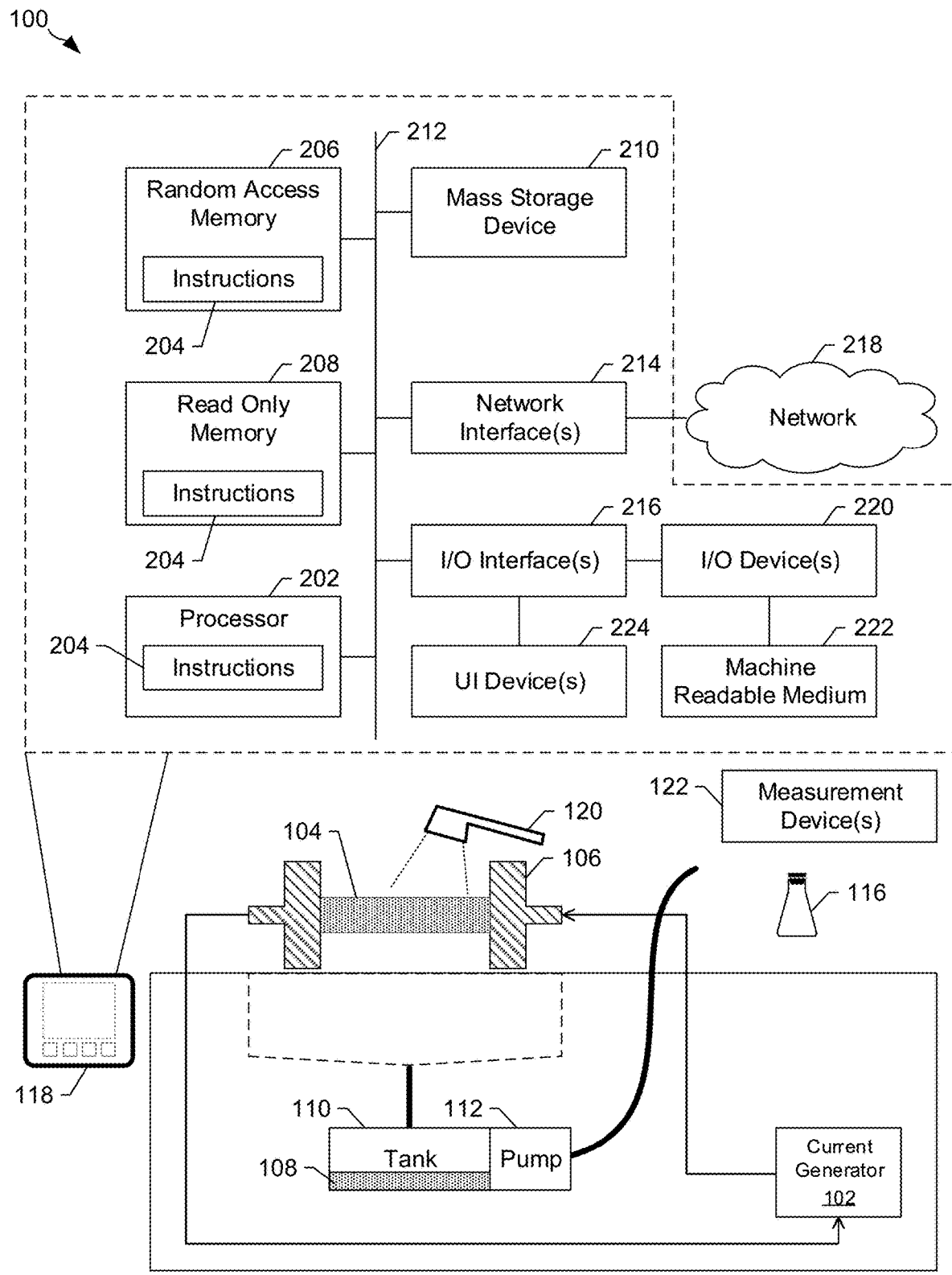
FIG. 1 shows an example magnetic particle testing system configured to use customized quality control tasks for non-destructive testing, in accordance with aspects of the present disclosure.

Magnetic particle testing is reliant on consistent conditions for reliable results. To this end, test conditions for particular equipment, such as magnetic web benches, magnetic particle solution (also referred to as "bath"), and/or light sources may be manually measured and recorded prior to beginning testing with the equipment. Conventional magnetic particle testing equipment relies on the operator to track whether calibrations or other test condition measurements have been performed within a reasonable time frame prior to beginning testing, and to determine that all appropriate test conditions have been checked.

Disclosed example systems and methods improve the consistency and quality of magnetic particle testing by providing a user interface that presents a checklist to an operator for performing calibration, measurements, and/or checks on the equipment, flagging problematic measurements or other results, and/or controlling one or more aspects of the equipment based on the performance of the calibrations, measurements, and/or checks.

In some disclosed examples, an operator checklist is customizable to enable an administrator of magnetic particle testing equipment to add, delete, modify, and/or otherwise control the calibration, measurements, and/or checks to be performed on the magnetic particle testing equipment. For example, while magnetic particle testing equipment may have a set of calibration, measurements, and/or checks specified by the manufacturer, an administrator of the magnetic particle testing equipment may determine that more, fewer, and/or alternative calibration, measurements, and/or checks are required for certain types of tests or parts. An administrator may specify a task definition, which may include one or more of a task name, a task description, one or more task results, a unit of measurement, a lower limit of the task result, an upper limit of the task result, a task performance frequency, task instructions, an operator authorization, a type of the magnetic particle inspection device or the penetrant testing device or a result alert response.

Disclosed example non-destructive testing (NDT) systems include: at least one of a magnetic particle inspection device or a penetrant testing device, a user interface device, a processor, and a memory coupled to the processor and storing machine readable instructions. When executed the instructions cause the processor to: access, from a computer readable storage device, a quality verification procedure comprising a plurality of tasks and corresponding task definitions; display, via the user interface device, one or more of the plurality of tasks based on statuses of the plurality of tasks; receive, via the user interface device, one or more results associated with the one or more of the plurality of tasks; store the one or more results in association with the magnetic particle inspection device or the penetrant testing device; and control at least one aspect of the magnetic particle inspection device or the penetrant testing device based on the one or more results.

In some examples, the instructions cause the processor to enable or disable operation of one or more components of the magnetic particle inspection device or the penetrant testing device in response to the one or more results. In some examples, the instructions cause the processor to store the one or more results in association with a nondestructive test result performed using the magnetic particle inspection device or the penetrant testing device. In some example systems, the instructions cause the processor to store the one or more results in association with an identifier of a device used to perform a corresponding one of the plurality of tasks.

In some examples, the instructions cause the processor to: access a task definition corresponding to one of the plurality of tasks; and store the task definition in association with the task. In some examples, the instructions cause the processor to: display, via the user interface device, an interface to enable input of the task definition; and determine the task definition based on input to the interface via the user interface device. In some examples, the input of the task definition includes at least one of: a task name, a task description, one or more task results, a unit of measurement, a lower limit of the task result, an upper limit of the task result, a task performance frequency, task instructions, an operator authorization, a type of the magnetic particle inspection device or the penetrant testing device, or a result alert response.

In some example systems, the task definition includes at least one of: a task name, a task description, one or more task results, a unit of measurement, a lower limit of the task result, an upper limit of the task result, a task performance frequency, task instructions, an operator authorization, a type of the magnetic particle inspection device or the penetrant testing device, or a result alert response. In some examples, a status of a first one of the tasks includes a completed state or an uncompleted state. In some example systems, the one or more results include at least one of an alphanumeric value or an indication of acceptability or unacceptability. In some examples, at least one of the tasks includes a subroutine configured to display a procedure to be followed.

While examples below are described with reference to a magnetic wet bench, the disclosed systems and methods are applicable to other types of NDT systems, including magnetic particle inspection systems and/or liquid penetrant testing systems.

FIG. 1 shows an example NDT system 100 configured to use customized quality control tasks for non-destructive testing. The NDT system 100 of FIG. 1 includes a current generator 102 that applies electrical current(s) to a to-be inspected part 104 via electrical contacts 106. In this regard, various magnetization approaches may be used to magnetize the inspected parts, with some systems allowing for selecting among such options. The magnetization may be achieved using, for example, AC (alternating current), half wave DC (direct current), or full wave DC (direct current). In some systems, a demagnetization function may be built into the system. For example, the demagnetization function may utilize a coil and decaying AC (alternating current).

During inspection, a wet magnetic particle solution 108 is applied to the part. The particle solution 108 (also called "bath") may comprise visible or fluorescent particles that may be magnetized. The particle solution 108 may be collected and held in a tank 110. A pump 112 pumps the bath through a hose 114 to apply the particle solution 108 to the parts 104 being inspected (e.g., via a nozzle that is used in spraying the parts) and/or to collect samples of the particle solution 108 in a container 116 for contamination analysis.

The NDT system 100 may also incorporate a controller unit 118 to allow operators to control the system 100 and/or inspections. In this regard, the controller unit 118 may comprise suitable circuitry and input/output components, as described in more detail below.

After preparation of the part 104, magnetizing current is then applied by the current generator 102 to the part 104 via the electrical contacts 106. Application of the magnetizing current may be done for a short duration, and precautions may be taken to prevent burning or overheating of the part 104. The application of the magnetizing current to the part 104 via the electrical contacts 106 creates a magnetic field in the part 104 (e.g., a circular field flowing around the circumference of the part 130). The magnetic field allows detection of defects in the part 104. For example, when utilizing magnetic wet benches, with the part 104 wet from the magnetic solution, defects, such as cracks, may be detectable as a result of leakage fields from these defects, which attract the magnetic particles in the solution to form indications. Indications may be visually detectable using one or more lamps 120.

While not specifically shown in the particular implementation illustrated in FIG. 1, magnetic inspection machines may comprise additional parts, for performing other/different functions. For example, in some instances, test-related material may be used (e.g., applied to the inspected parts) during magnetic-based inspections, such as to enable and/or facilitate defect detection. These additional components or functions may be determined based on type of the machine and/or inspections performed using the machines.

The example controller 118, in addition to providing controls for components of the system 100 (e.g., controlling the pump 112, the current generator 102, etc.), the example controller 118 displays a quality checklist to prompt the operator to perform one or more calibrations, measurements, and/or checks. In some examples, one or more measurement device(s) 122 are used to perform the calibrations, measurements, and/or checks of the magnetic particle equipment and/or materials.

The example controller 118 is a computing system, such as an integrated computing device, a desktop or all-in-one computer, a server, a laptop or other portable computer, a tablet computing device, a smartphone, and/or any other type of computing device.

The example controller 118 of FIG. 1 includes a processor 202. The example processor 202 may be any general purpose central processing unit (CPU) from any manufacturer. In some other examples, the processor 202 may include one or more specialized processing units, such as RISC processors with an ARM core, graphic processing units, digital signal processors, and/or system-on-chips (SoC). The processor 202 executes machine readable instructions 204 that may be stored locally at the processor (e.g., in an included cache or SoC), in a random access memory 206 (or other volatile memory), in a read only memory 208 (or other non-volatile memory such as FLASH memory), and/or in a mass storage device 210. The example mass storage device 210 may be a hard drive, a solid state storage drive, a hybrid drive, a RAID array, and/or any other mass data storage device.

A bus 212 enables communications between the processor 202, the RAM 206, the ROM 208, the mass storage device 210, a network interface 214, and/or an input/output interface 216.

The example network interface 214 includes hardware, firmware, and/or software to connect the computing system 200 to a communications network 218 such as the Internet.

For example, the network interface 214 may include IEEE 202.X-compliant wireless and/or wired communications hardware for transmitting and/or receiving communications.

The example I/O interface 216 of FIG. 1 includes hardware, firmware, and/or software to connect one or more user interface devices 220 to the processor 202 for providing input to the processor 202 and/or providing output from the processor 202. For example, the I/O interface 216 may include a graphics processing unit for interfacing with a display device, a universal serial bus port for interfacing with one or more USB-compliant devices, a FireWire, a field bus, and/or any other type of interface. The example computing system 200 includes a user interface device 224 coupled to the I/O interface 216. The user interface device 224 may include one or more of a keyboard, a keypad, a physical button, a mouse, a trackball, a pointing device, a microphone, an audio speaker, an optical media drive, a multi-touch touch screen, a gesture recognition interface, and/or any other type or combination of types of input and/or output device(s). While the examples herein refer to a user interface device 224, these examples may include any number of input and/or output devices as a single user interface device 224. Other example I/O device(s) 220 an optical media drive, a magnetic media drive, peripheral devices (e.g., scanners, printers, etc.), and/or any other type of input and/or output device.

The example computing system 200 may access a non-transitory machine readable medium 222 via the I/O interface 216 and/or the I/O device(s) 220. Examples of the machine readable medium 222 of FIG. 1 include optical discs (e.g., compact discs (CDs), digital versatile/video discs (DVDs), Blu-ray discs, etc.), magnetic media (e.g., floppy disks), portable storage media (e.g., portable flash drives, secure digital (SD) cards, etc.), and/or any other type of removable and/or installed machine readable media.

Figure 2:
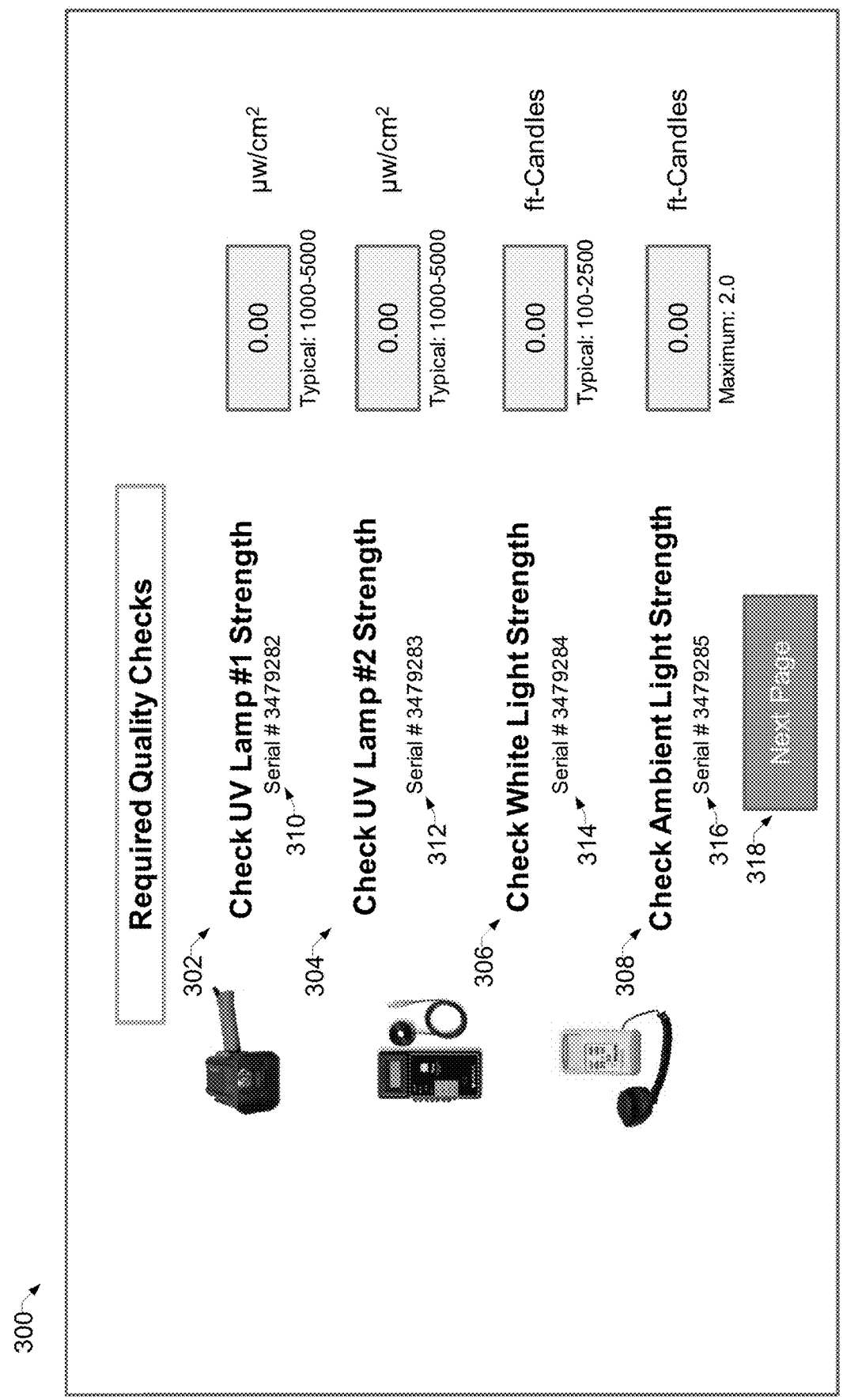
FIGS. 2, 3, and 4 illustrate example interfaces that may be presented by the controller of FIG. 1.

FIG. 2 is an example interface 300 that may be presented by the controller 118 of FIG. 1 (e.g., via the user interface device(s) 324). The interface 300 may be presented in response to a determination that a quality procedure is to be performed on the NDT system 100 of FIG. 1. The quality procedure may be performed, for example, with a particular frequency (e.g., every X hours), in response to an event (e.g., at the start of an operator shift), and/or based on any other criteria.

The interface 300 includes several tasks 302, 304, 306, 308. The example tasks 302-308 include measuring an output strength of first and second ultraviolet (UV) lamps (e.g., tasks 302, 304), measuring an output strength of a white light lamp (e.g., task 306), and measuring an ambient light strength (e.g., task 308). The example tasks 302-308 may involve using the measurement devices(s) 122 to measure a designated output and entering the resulting measurement into the interface 300. Each of the example tasks 302-308 is associated with an identifier 310-316 of the measurement device(s) 122 used to perform the task 302-308. In this manner, if a problem with the measurement device(s) 122 is identified later, the affected tasks and parts may be easily identified by cross-referencing the identifier 310-316 to the tasks 302-308 and/or tested parts.

When the tasks 302-308 have been completed by the operator (e.g., by entering corresponding values via the user interface device 224), the operator may select a button 318 to continue to a subsequent set of tasks (if defined) and/or to complete the checklist to proceed to a part testing interface.

Figure 3:
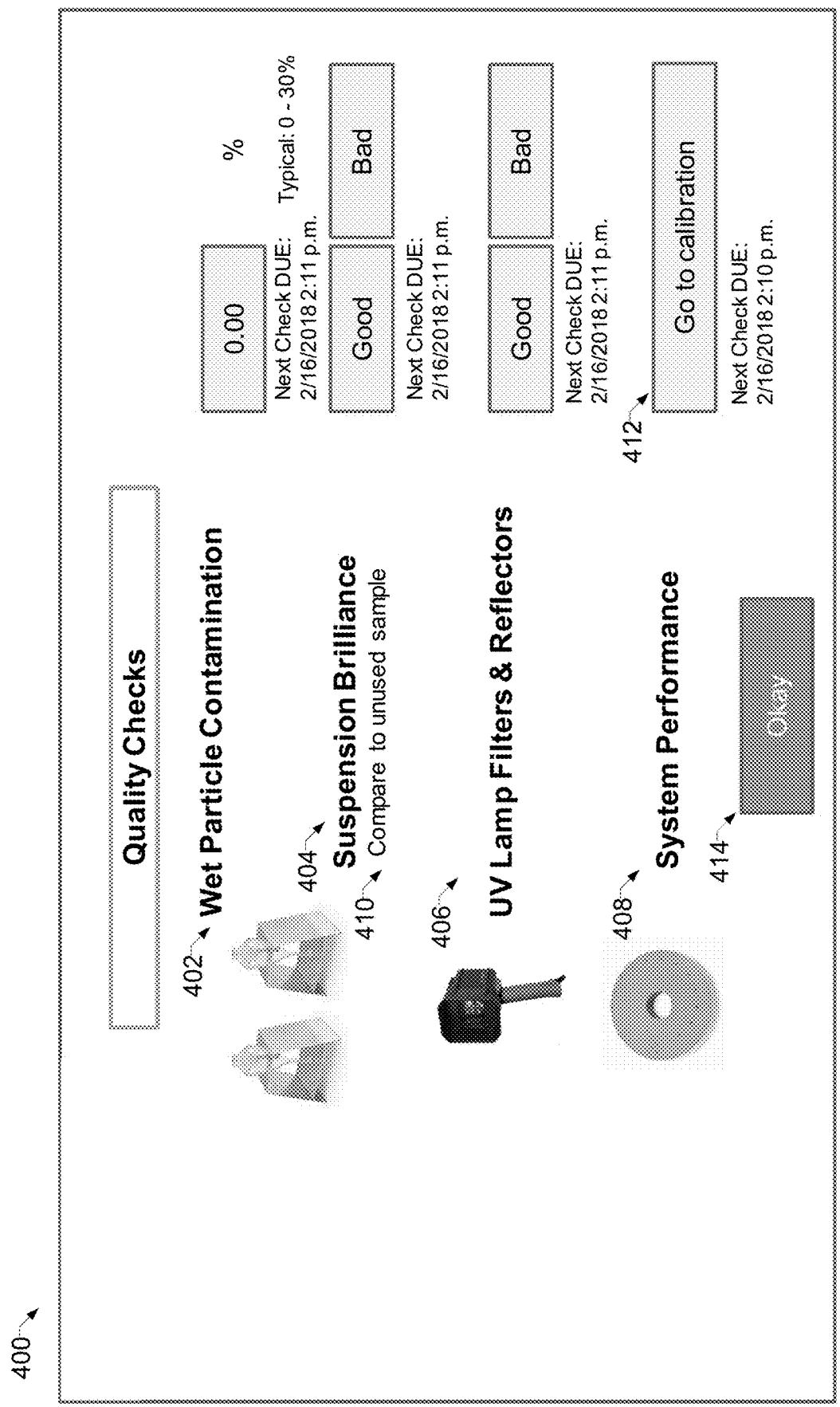

FIG. 3 is an example interface 400 that may be presented by the controller 118 of FIG. 1 (e.g., via the user interface device(s) 324). The example interface 400 may be presented following selection of the button 318 of FIG. 2, and/or as an alternative to the interface 300 of FIG. 2 based on the set of tasks to be included in a quality check procedure.

The example interface 400 of FIG. 3 includes example tasks 402, 404, 406, 408. The tasks 402-408 of FIG. 3 involve determining wet particle contamination (e.g., task 402), determining whether suspension brilliance is adequate (e.g., task 404), determining whether the UV lamp filters and/or reflectors are operational (e.g., task 406), and/or calibrating the system 100 (e.g., task 408). The example task 404 is shown with specific instructions 410, though any of the tasks 302-308, 402-408 may be provided with instructions for performance, either in the interfaces 300, 400 or in a separate dialog.

The example task 402 includes an input for a alphanumeric value of contamination, while the example tasks 404, 406 provide for a simple "good" (e.g., acceptable) or "bad" (e.g., unacceptable) input. The example task 408 includes a subroutine button 412 that, when selected, may provide the operator with a calibration procedure to be followed, and which may be too complex for display in the interface 400 with the tasks 402-408.

When the tasks 402-408 have been completed by the operator (e.g., by entering corresponding values via the user interface device 224), the operator may select a button 414 to continue to a subsequent set of tasks (if defined) and/or to complete the checklist to proceed to a part testing interface.

Figure 4:
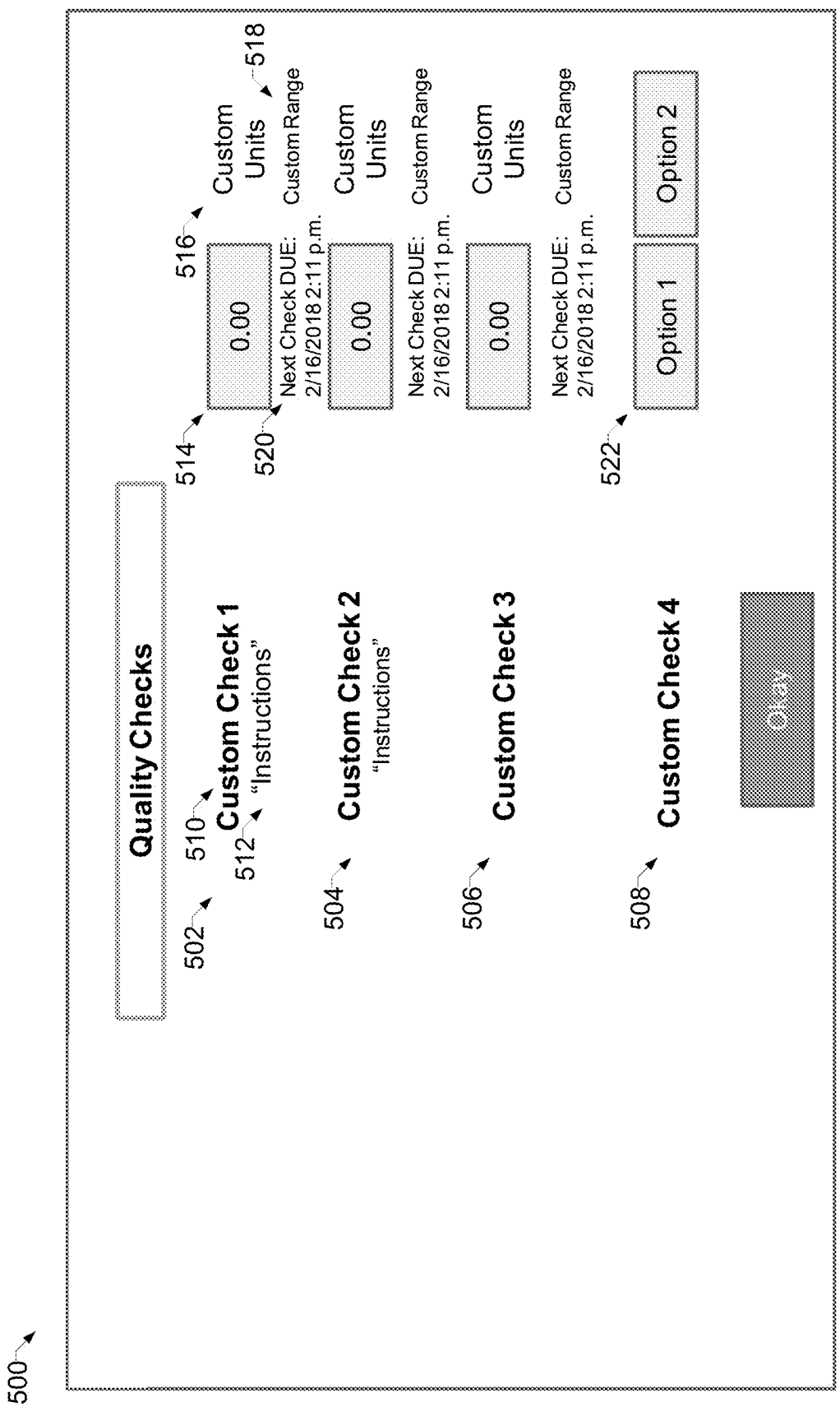

FIG. 4 is another example interface 500 that may be presented by the controller 118 of FIG. 1 (e.g., via the user interface device(s) 324). The example interface 500 may be presented following selection of the buttons 318 or 414 of FIG. 2 or 3, and/or as an alternative to the interfaces 300, 400 of FIG. 2 or 3 based on the set of tasks to be included in a quality check procedure. The example interface 500 includes a set of custom tasks 502, 504, 506, 508, which may include measurements, checks, and/or calibration procedures to be performed by the operator on the system 100.

The custom tasks 502-508 may include a custom task name, a custom task description, one or more custom task results, a unit of measurement, a lower limit of the custom task result, an upper limit of the custom task result, a custom task performance frequency, a custom task performance time and/or date, custom task instructions, custom operator authorization to perform the task, type(s) of the magnetic particle inspection device or the penetrant testing device to which the task may be applied, and/or a custom result alert response. For example, the task 502 includes a task name 510 "Custom Task 1," custom instructions 512 "Instructions," a numeric input 514 associated with a unit of measurement 516 and a custom range 518 (e.g., a lower limit and an upper limit), and a custom task performance time and date 520. In contrast, the example task 508 is defined to have a selectable input 522 "Option 1" or "Option 2."

Figure 5:
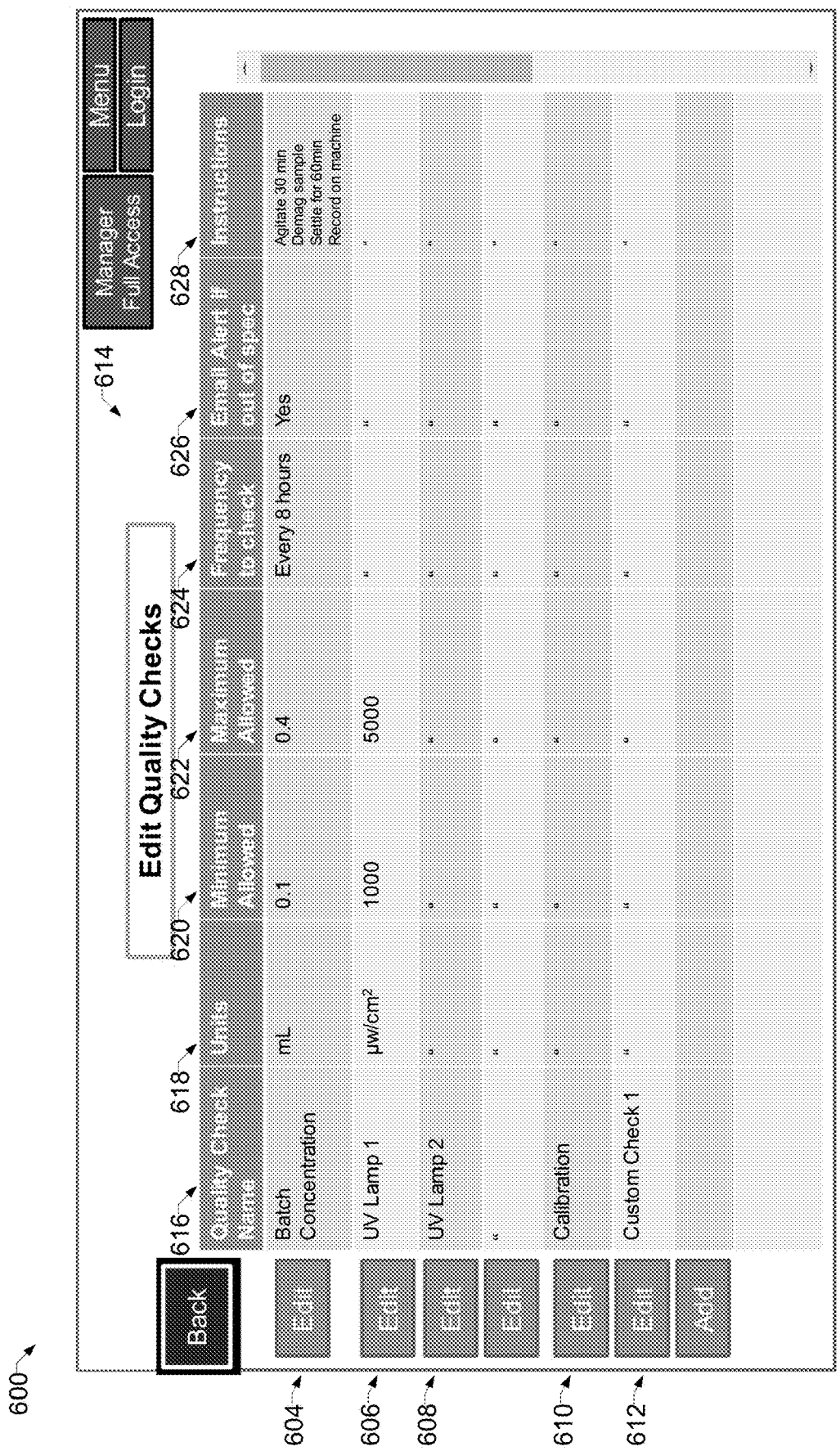
FIG. 5 is an example interface that may be presented by the controller of FIG. 1, and/or by a remote computing device, to enable customization of a set of tasks to be presented at the controller and/or performed by the operator of the system of FIG. 1.

FIG. 5 is an example interface 600 that may be presented by the controller 118 of FIG. 1, and/or by a remote computing device, to enable customization of a set of tasks to be presented at the controller 118 and/or performed by the operator of the system 100 of FIG. 1. The example interface 600 includes table 602 listing defined tasks 604-612 and corresponding task definition summaries 614. The task definition summaries 614 shows, for each of the tasks 604-612, the task name 616, unit of measurement 618, lower limit 620, upper limit 622, task frequency 624, alert action 626, and displayed instructions 628.

Each of the example tasks 604-612 includes an edit button 630-638 to enable an administrator of the system 100 to edit the task definitions (or delete the task), and an add button 640 to create a new task definition. However, other interface techniques to select a task for editing may be used (e.g., radio or checkmark objects and a common "edit" or "delete" button).

The tasks 604-612 and results of tasks may be stored, for example, in a database format to enable ease of reference between task definitions and task results. Changing a task definition cause the controller 118 to, for example, preserve the old database entry for the task for cross-referencing with previous results of checks performed according to the task definition, and to create a new database entry with the new task definition to be referenced for subsequently performed tasks.

Figure 6:
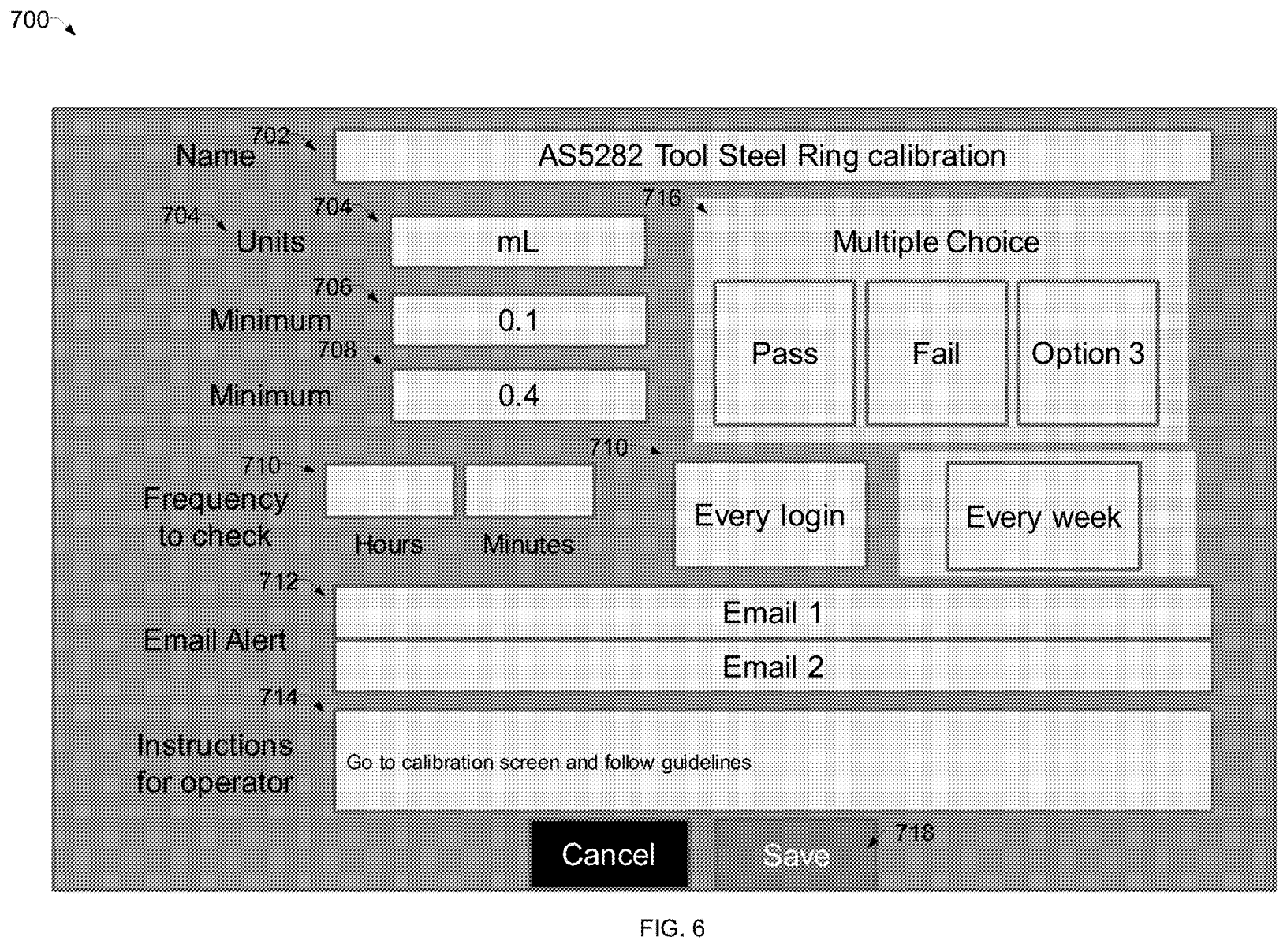

FIG. 6 is an example interface 700 that may be presented by the controller 118 of FIG. 1, and/or by a remote computing device, to modify a task definition. The example interface 700 may be presented in response to selection of one of the edit buttons 630-638 of FIG. 5. The interface 700 enables an administrator to define the task definition for one or more tasks, including defining (and/or leaving undefined) one or more of: the task name 702, unit of measurement 704, lower limit 706, upper limit 708, task frequency 710, alert action 712, custom instructions 714, or input type 716. The interface 700 may be populated with the task definition information for the task 604-612 that was selected for editing.

When the user (e.g., administrator) has finished entering data, the user may select a save button 718 to store the task definition information as a modified or new task. In response, the example task definition and corresponding task characteristics may be populated into the database and displayed in the interface 600 of FIG. 5.

Figure 7:
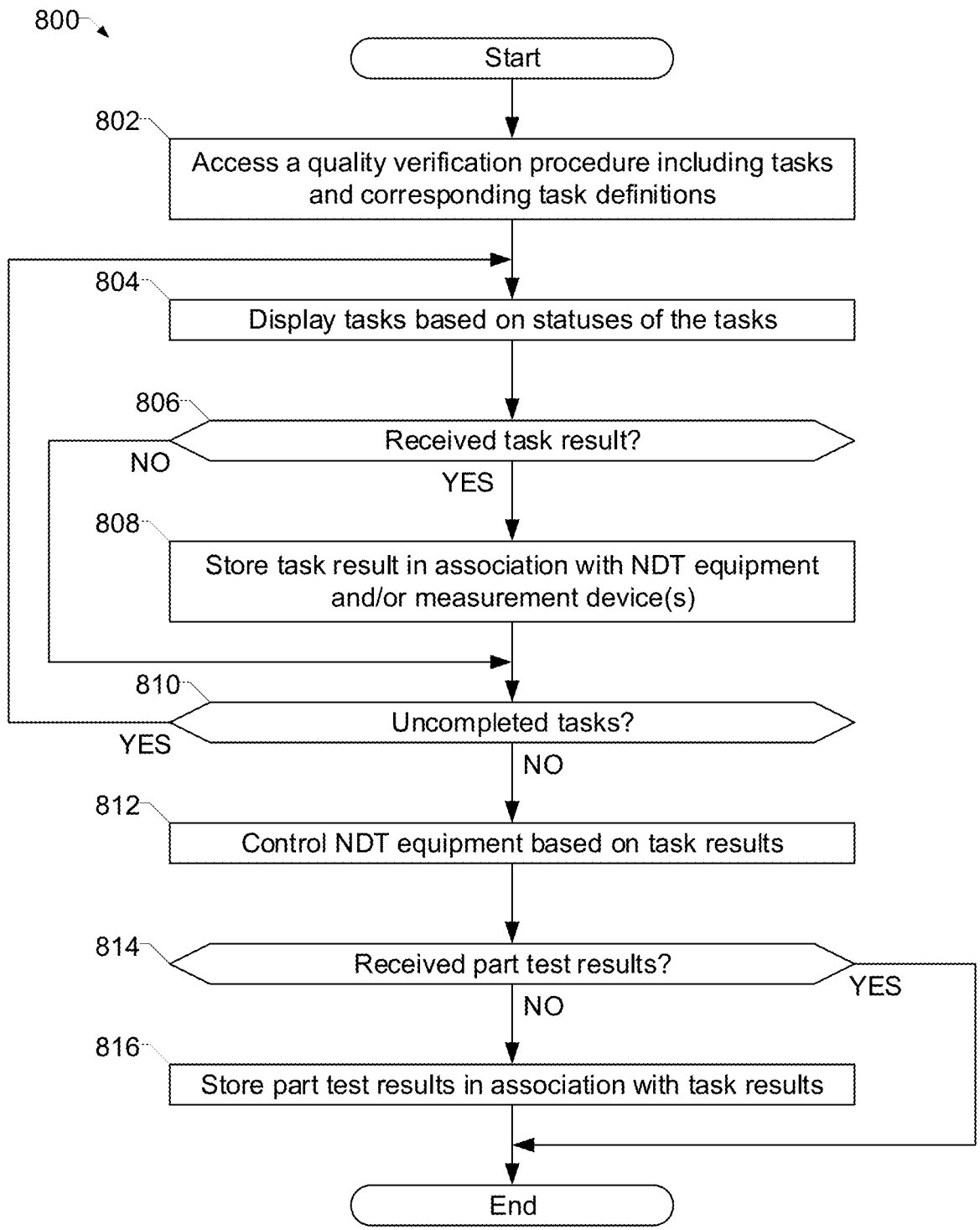
FIG. 7 is a flowchart representative of example machine readable instructions which may be executed by the example controller of FIG. 1 to control a non-destructive testing device.

FIG. 7 is a flowchart representative of example machine readable instructions 800 which may be executed by the example controller 118 of FIG. 1 to control a non-destructive testing device. The example instructions 800 may be performed by, for example, the processor 202 of FIG. 1 executing the instructions 204.

At block 802, the processor 202 accesses a quality verification procedure including tasks and corresponding task definitions. For example, the task definitions may be stored in the mass storage device 210 and/or received from a remote device via the network interface(s) 214.

At block 804, the processor 202 displays tasks based on statuses of the tasks. For example, the statuses may include "completed' or "uncompleted," based on whether an input has been received for the corresponding task.

At block 806, the processor 202 determines whether a task result has been received. For example, the processor 202 may receive an input for a result of a task via the user interfaces 300, 400, 500 of FIGS. 2-4 via the user interface device 224. If a task result has been received (block 806), at block 808 the processor 202 stores the task result in association with the NDT equipment (e.g., the system 100) and/or the measurement device(s) 122 used to perform the measurements.

After storing the task result (block 808), or if a task result has not been received (block 806), at block 810 the processor 202 determines whether there any uncompleted tasks to be performed. If there are uncompleted tasks to be performed (block 810), control returns to block 804.

When there are no more uncompleted tasks (block 810), at block 812 the processor 202 controls the NDT equipment (e.g., the system 100) based on the task results. In some examples, the processor 202 enables and/or disables operation of the system 100 (e.g., disables the current generator 102 and/or the pump 112) based on the task results.

At block 814, the processor 202 determines whether part test results have been received. If part test results have been received (block 814), at block 816 the processor 202 stores the part test results in association with the task results. After storing the part test results (block 816), or if no part test results have been received (block 814), the example instructions 800 may end.

Other implementations in accordance with the present disclosure may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various implementations in accordance with the present disclosure may be realized in hardware, software, or a combination of hardware and software. The present disclosure may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various implementations in accordance with the present disclosure may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present disclosure has been described with reference to certain implementations, it will be understood by those skilled in the art that various changes may be made and equivalents may be substituted without departing from the scope of the present disclosure. For example, block and/or components of disclosed examples may be combined, divided, re-arranged, and/or otherwise modified. In addition, many modifications may be made to adapt a particular situation or material to the teachings of the present disclosure without departing from its scope. Therefore, it is intended that the present disclosure not be limited to the particular implementation disclosed, but that the present disclosure will include all implementations falling within the scope of the appended claims.

What is claimed is:

1. A non-destructive testing (NDT) system, comprising:
   at least one of a magnetic particle inspection device or a penetrant testing device;
   a user interface device;
   a processor; and
   a memory coupled to the processor and storing machine readable instructions which, when executed, cause the processor to:
   access, from a computer readable storage device, a quality verification procedure comprising a plurality of tasks and corresponding task definitions, wherein the plurality of tasks comprises at least one of a calibration, a test condition measurement, or a check of a test condition, on at least one of a current generator, a lamp, a pump, or a particle solution;

display, via the user interface device, one or more of the plurality of tasks based on statuses of the plurality of tasks;

receive, via the user interface device, one or more results associated with the one or more of the plurality of tasks, wherein the one or more results are results of the at least one of the calibration, the test condition measurement, or the check of the test condition;

store the one or more results in association with the magnetic particle inspection device or the penetrant testing device; and control at least one aspect of the magnetic particle inspection device or the penetrant testing device based on the one or more results.

2. The NDT system as defined in claim 1, wherein the instructions, when executed, cause the processor to enable or disable operation of one or more components of the magnetic particle inspection device or the penetrant testing device in response to the one or more results.

3. The NDT system as defined in claim 1, wherein the instructions, when executed, cause the processor to store the one or more results in association with a nondestructive test result performed using the magnetic particle inspection device or the penetrant testing device.

4. The NDT system as defined in claim 1, wherein the instructions, when executed, cause the processor to store the one or more results in association with an identifier of a measurement device used to perform a corresponding one of the plurality of tasks.

5. The NDT system as defined in claim 1, wherein the instructions, when executed, cause the processor to:

access a task definition corresponding to one of the plurality of tasks; and store the task definition in association with the task.

6. The NDT system as defined in claim 5, wherein the instructions, when executed, cause the processor to:

display, via the user interface device, an interface to enable input of the task definition; and determine the task definition based on input to the interface via the user interface device.

7. The NDT system as defined in claim 6, wherein the input of the task definition comprises at least one of: a task name, a task description, one or more task results, a unit of measurement, a lower limit of the task result, an upper limit of the task result, a task performance frequency, task instructions, an operator authorization, a type of the magnetic particle inspection device or the penetrant testing device, or a result alert response.

8. The NDT system as defined in claim 5, wherein the task definition comprises at least one of: a task name, a task description, one or more task results, a unit of measurement, a lower limit of the task result, an upper limit of the task result, a task performance frequency, task instructions, an operator authorization, a type of the magnetic particle inspection device or the penetrant testing device, or a result alert response.

9. The NDT system as defined in claim 1, wherein a status of a first one of the tasks comprises a completed state or an uncompleted state.

10. The NDT system as defined in claim 1, wherein the one or more results comprise at least one of an alphanumeric value or an indication of acceptability or unacceptability.

11. The NDT system as defined in claim 1, wherein at least one of the tasks comprises a subroutine configured to display a procedure to be followed.

12. The NDT system as defined in claim 1, wherein the plurality of tasks comprises at least one of a ultraviolet lamp strength measurement, a white light strength measurement, an ambient light strength measurement, a wet particle contamination measurement, a suspension brilliance check, an ultraviolet lamp filter check, an ultraviolet lamp reflector check, or a system performance calibration.

13. A non-destructive testing (NDT) system, comprising:

at least one of a magnetic particle inspection device or a penetrant testing device;

a user interface device;

a processor; and a memory coupled to the processor and storing machine readable instructions which, when executed, cause the processor to:

access, from a computer readable storage device, a quality verification procedure comprising a plurality of tasks and corresponding task definitions;

display, via the user interface device, one or more of the plurality of tasks based on statuses of the plurality of tasks;

receive, via the user interface device, one or more results associated with the one or more of the plurality of tasks;

store the one or more results in association with the magnetic particle inspection device or the penetrant testing device;

enable or disable operation of the magnetic particle inspection device or the penetrant testing device in response to the one or more results; and control at least one aspect of the magnetic particle inspection device or the penetrant testing device based on the one or more results.

14. The NDT system as defined in claim 13, wherein the instructions cause the processor to disable operation of the magnetic particle inspection device or the penetrant testing device by disabling at least one of a current generator or a pump.

15. The NDT system as defined in claim 13, wherein the plurality of tasks comprises at least one of a ultraviolet lamp strength measurement, a white light strength measurement, an ambient light strength measurement, a wet particle contamination measurement, a suspension brilliance check, an ultraviolet lamp filter check, an ultraviolet lamp reflector check, or a system performance calibration.

* * * * *